(12) United States Patent
Chen et al.

(10) Patent No.: US 8,199,274 B2
(45) Date of Patent: Jun. 12, 2012

(54) PIXEL STRUCTURE

(75) Inventors: Chien-Ming Chen, Taipei County (TW);
Kuang-Kuei Wang, Taipei (TW);
Chia-Ming Chiang, Taoyuan County (TW); Chi-Liang Luo, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 587 days.

(21) Appl. No.: 12/388,498

(22) Filed: Feb. 18, 2009

(65) Prior Publication Data

US 2010/0026923 A1 Feb. 4, 2010

(30) Foreign Application Priority Data

Aug. 1, 2008 (TW) ................................. 97129279 A

(51) Int. Cl.
*G02F 1/1343* (2006.01)

(52) U.S. Cl. .......................................................... 349/55

(58) Field of Classification Search ................... 349/139, 349/55

See application file for complete search history.

(56) References Cited

U.S. PATENT DOCUMENTS

2009/0219473 A1* 9/2009 Fujioka et al. ................ 349/114

* cited by examiner

*Primary Examiner* — Eric Wong
(74) *Attorney, Agent, or Firm* — Winston Hsu; Scott Margo

(57) ABSTRACT

A repairable pixel structure includes a substrate, at least a data line, at least a gate line, a transparent pixel electrode, a TFT, and a transparent pre-repair electrode. The TFT includes a gate, a drain, and a source. The transparent pre-repair electrode is disposed corresponding to the electrode in a vertical direction and is electrically connected to the drain. When a broken circuit occurs in the pixel structure, a laser beam is provided to perform a welding process on the transparent pre-repair electrode for repairing the pixel structure.

9 Claims, 9 Drawing Sheets

PIXEL STRUCTURE

BACKGROUND OF THE INVENTION

1. Field of the Invention

The present invention is related to a pixel structure and a method for repairing the same, and particularly, to a pixel structure capable of repairing the drain thereof and a method of repairing the same.

2. Description of the Prior Art

With the development of fabricating technology, liquid crystal displays (LCDs) have been widely used as display devices. LCDs have the advantages of higher definition, smaller volume, lighter weight, lower driving voltage and power consumption over other conventional display devices. LCDs are used in electronic display devices and computer hardware, such as portable televisions (TVs), mobile phones, camcorders, laptop computers, desktop display devices, and projector TVs. The liquid crystal molecules of the LCDs are rearranged by means of applying an electric field to change the lights passing through the liquid crystal molecules which results in the variation in light and shade effects. Until now, the development of LCDs has been roughly separated into two types: active-matrix LCDs and passive-matrix LCDs, wherein the active-matrix LCDs are the main product at present. In the active-matrix LCD, the thin film transistors (TFTs) or other active elements formed in the pixel electrode control the input of data to the LCD. Therefore, TFTs or other active elements are the main research and development targets in LCD technology.

Please refer to FIG. 1 and FIG. 2. FIG. 1 and FIG. 2 are schematic diagrams of a pixel structure 10 of a conventional LCD. FIG. 1 is a plane view diagram of the pixel structure 10, while FIG. 2 is a schematic cross-sectional view taken along the line A-A'-A" in FIG. 1. Please refer to both FIG. 1 and FIG. 2. A pixel structure 10 formed on the substrate 12 comprises a first metal layer having a gate 14 and a gate line 16, a gate isolation layer 20, a semiconductor layer 22, a second metal layer 30 having a data line 24, a source 26, and a drain 28, a passivation layer 32, and a pixel electrode 34. The first metal layer is disposed on the substrate 12, and the gate isolation layer 20 is formed on the substrate 12 and covers the first metal layer. The second metal layer 30 is disposed on the gate isolation layer 20, and the source 26 and the drain 28 are disposed on each side of the gate 14. The passivation layer 32 is disposed on the gate isolation layer 20 and covers the second metal layer 30. The passivation layer 32 is covered by the pixel electrode 34. The pixel electrode 34 is electrically connected to the drain 28 via a contact hole 36, and the source 26 is electrically connected to the data line 24.

During the process of fabricating the conventional LCD, inappropriate control of process parameters or other unpredictable reasons may lead to defects, such as short circuits and broken circuits in the pixel structure 10. For example, the drain 28 in FIG. 2 is electrically connected to the pixel electrode 34 via the contact hole 36, so as to input a voltage from the data line 24 to the pixel electrode 34. However, there is a height difference in the drain 28 of the pixel structure 10 of the conventional LCD. A turning portion 38 between the upper and lower surface (as shown in FIG. 2) tends to break, in which causes a broken circuit, and thus the pixel structure 10 cannot be driven and are scraped, leading to problems such as insufficient yield rate and increase in costs.

SUMMARY OF THE INVENTION

Thus, one objective of the present invention is to provide a repairable pixel structure and method of repairing the same, to solve the common problems that occur in conventional LCDs, such as the broken circuits of the drain.

To achieve the above-mentioned goal, the present invention provides a pixel structure having a substrate, a first metal layer, a first dielectric layer, a semiconductor layer, a second metal layer, and a second dielectric layer disposed on the substrate. The first metal layer has a first pattern and includes at least a gate line. The first dielectric layer is disposed on the substrate and covers the first metal layer. In addition, the semiconductor layer is disposed on the first dielectric layer, and has at least a channel, which is disposed on top of the gate line. The second metal layer of the pixel structure is disposed on the first dielectric layer and the semiconductor layer. The second metal layer has a second pattern and includes at least a data line, at least a source and at least a drain. The second dielectric layer is disposed on the second metal layer, the semiconductor layer, and the first dielectric layer. Additionally, the pixel structure further includes a transparent electrode layer, which is disposed on the second dielectric layer. The transparent electrode layer has a transparent pixel electrode, which is electrically connected to the drain, and a transparent pre-repair electrode disposed corresponding to the drain in a vertical direction and electrically connected to the drain. When a broken circuit occurs in the drain of the pixel structure, the transparent pre-repair electrode can be utilized for repairing the pixel structure.

To achieve the above-mentioned goal, the present invention provides a method of repairing a pixel structure of an LCD according to another present embodiment of the present invention. First of all, a pixel structure is provided. The pixel structure comprises a substrate, at least a gate line, at least a data line, a transparent pixel electrode, a TFT, and a transparent pre-repair electrode. The TFT comprises a gate, a drain and a source. If the drain of the TFT is broken and departed into two parts, an upper drain electrically connected to the transparent pre-repair electrode and a lower drain electrically connected to the transparent pixel electrode, a laser beam is provided to perform a welding process to weld the transparent pre-repair electrode and the lower drain.

To sum up, the present invention provides a repairable pixel structure of an LCD and the method of repairing the same. When the drain of the pixel structure is broken and results in a broken circuit, a laser beam may be used to weld the transparent pre-repair electrode and the drain for repairing the defect pixel structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, reference will be made in detail to the present embodiments. Examples of the present embodiments are illustrated in the accompanying drawings with numbered elements.

Figure 1:
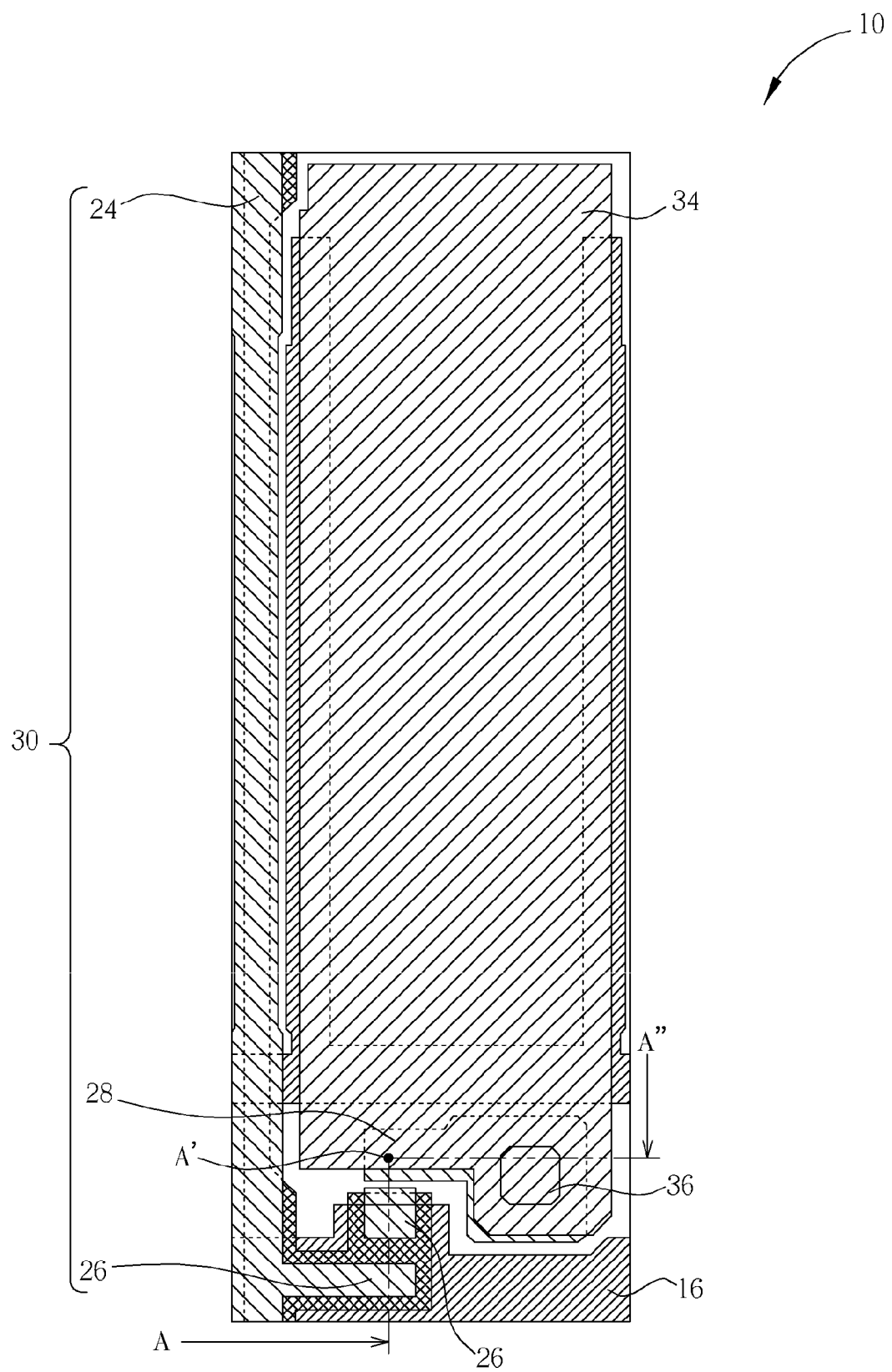
FIG. 1 and FIG. 2 are each schematic diagrams of a pixel structure of a conventional LCD.
Figure 2:
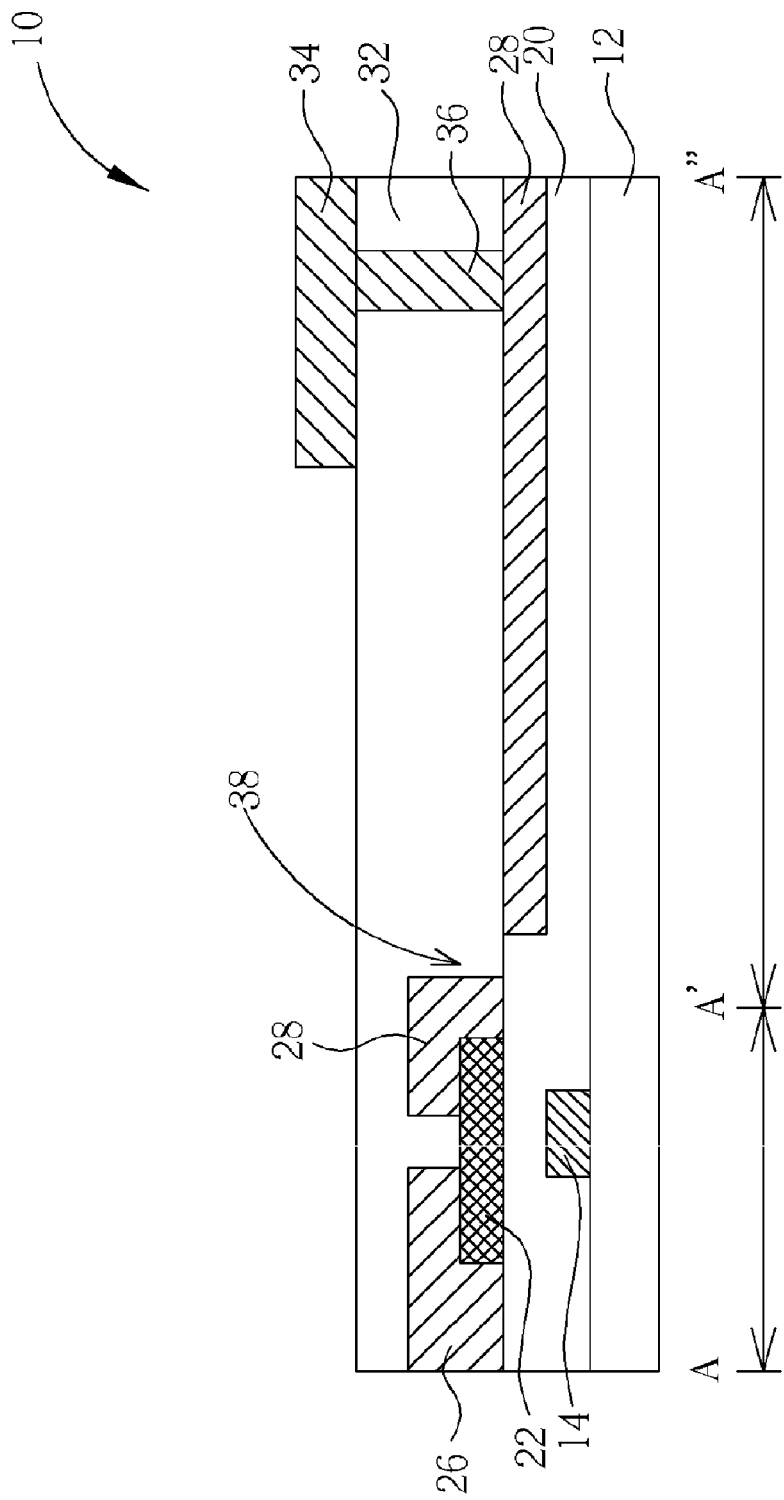
Figure 3:
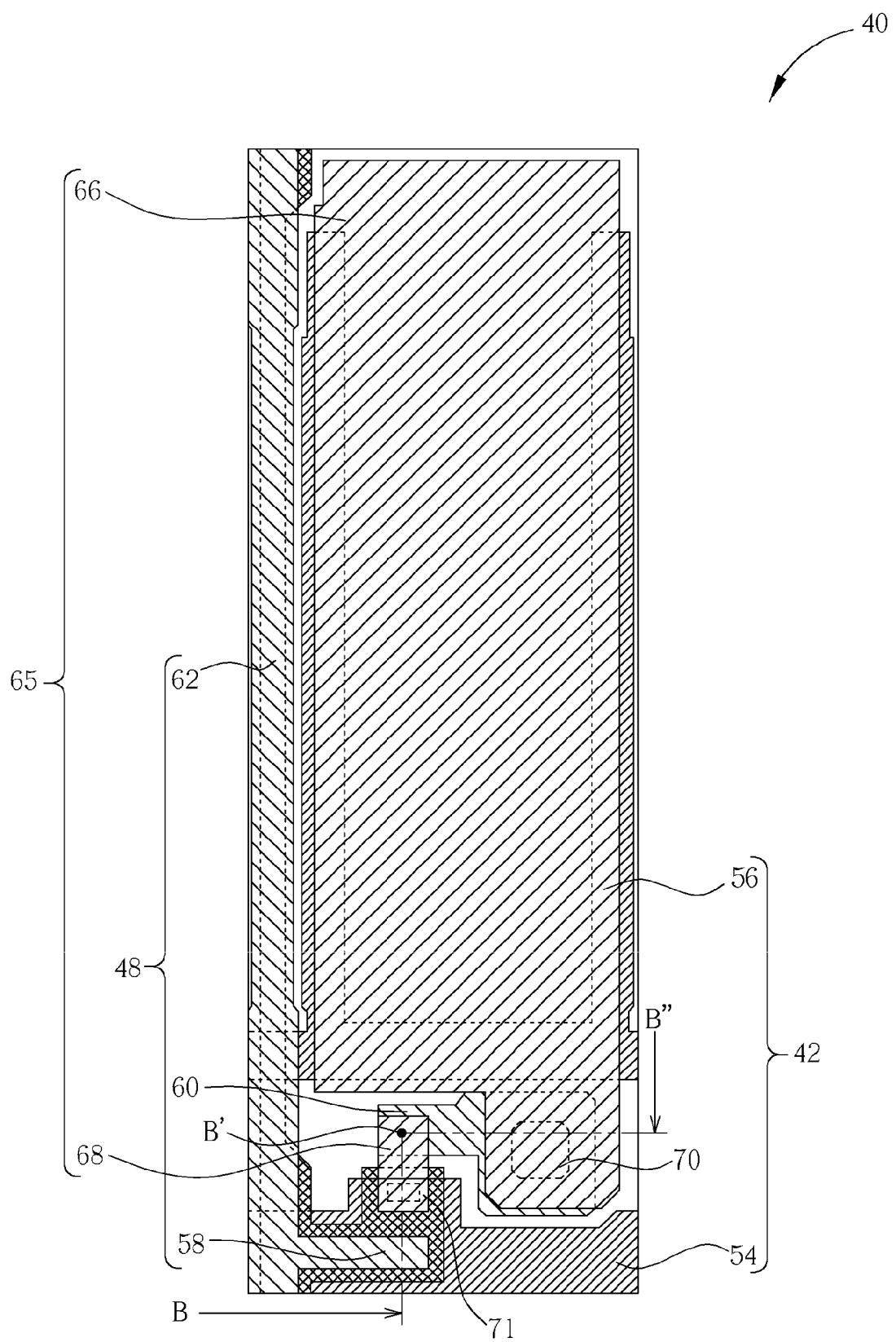
FIG. 3 and FIG. 4 are schematic diagrams of a pixel structure according to a present embodiment of the present invention.
Figure 4:
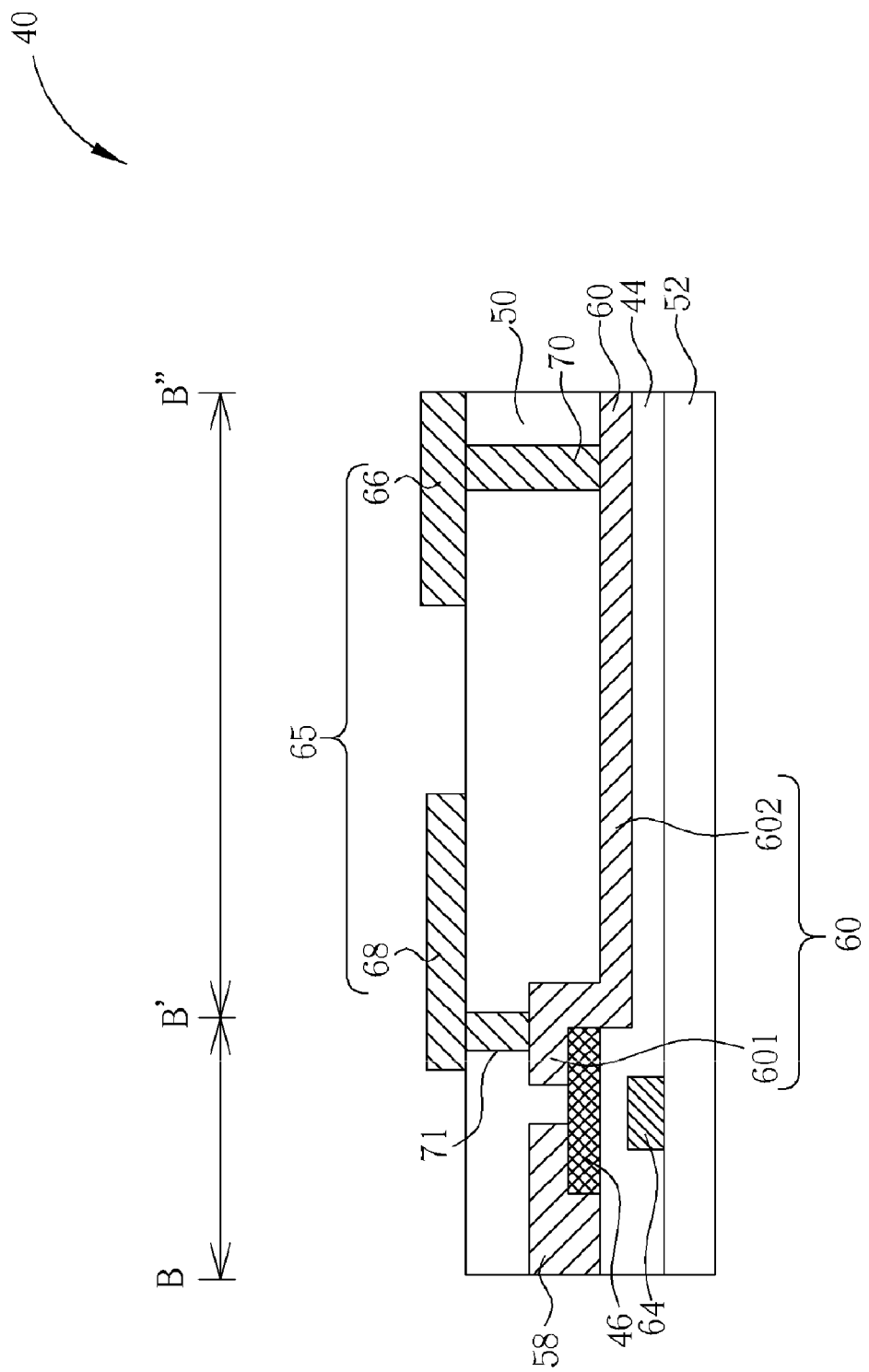

The present embodiments of the present invention are applied in thin-film transistor liquid crystal displays (TFT-LCDs). For simplifying illustration, the figures and the present embodiments are corresponded to a single pixel structure of the LCD, but the present invention is not limited to the present embodiments. Please refer to FIG. 3 and FIG. 4. FIG. 3 and FIG. 4 are schematic diagrams of a pixel structure 40 according to a present embodiment of the present invention. FIG. 3 is a plane view diagram of the pixel structure 40, and FIG. 4 is a schematic cross-sectional view along the line B-B'-B" in FIG. 3. The pixel structure 40 includes a first metal layer 42, a first dielectric layer 44, a semiconductor layer 46, a second metal layer 48, and a second dielectric layer 50 sequentially disposed on the substrate 52. The first metal layer 42 has a first pattern, including a gate line 54 and a common electrode 56 for forming the pixel structure 40. The substrate 52 in the present embodiment is a transparent glass substrate, and the material of the first metal layer 42 includes metals with good conductivity such as aluminum (Al), copper (Cu), tantalum (Ta), titanium (Ti), molybdenum (Mo), or alloys of the combinations thereof.

The first dielectric layer 44 of the pixel structure 40 covers the substrate 52 and the gate line 54 and the common electrode 56 of the first metal layer 42. The first dielectric layer 44 may include dielectric materials, such as silicon oxide or silicon nitride, formed by a deposition process on the surface of the substrate 52, the gate line 54 and the common electrode 56 and act as a gate isolation layer.

The semiconductor layer 46 of the pixel structure 40 forms on the first dielectric layer 44 and is defined as a silicon island acting as the channel of the TFT for controlling the pixel structure 40. In addition, a second metal layer 48 is disposed on the first dielectric layer 44. The second metal layer 48 has a second pattern and includes a source 58, a drain 60 and a data line 62. The material of the second metal layer 50 includes, but is not limited to, metals with good conductivity, such as aluminum (Al), copper (Cu), tantalum (Ta), titanium (Ti), molybdenum (Mo), or alloys of the combinations thereof. The source 58, the drain 60, the semiconductor, and a gate 64 are components of a TFT of the pixel structure 40 of the present invention. The source 58 is electrically connected to the data line 62 and the gate 64, which is extended from the gate line 54 and is disposed underneath the semiconductor layer 46. In addition, as shown in FIG. 4, the drain 60 in the present embodiment of the present invention has a Z-shaped step-like structure, and is located at one side of the channel. The drain 60 includes an upper drain 601 adjacent to a side of the channel and a lower drain 602 electrically connected to the upper drain 601.

The second dielectric layer 50 of the pixel structure 40 covers the second metal layer 48, the semiconductor layer 46, and the first dielectric layer 44 to serve as a passivation layer and to protect the elements underneath. The second dielectric layer 50 is formed on the second metal layer 48, the semiconductor layer 46, and the first dielectric layer 44 by a deposition process, and a planarization process is performed to form a flat surface. The thickness of the second dielectric layer 50 may be adjusted according to requirements.

In addition, the pixel structure 40 further includes a transparent electrode layer 65. The transparent electrode layer 65 further includes a transparent pixel electrode 66 and a transparent pre-repair electrode 68 disposed on the second dielectric layer 50. The transparent pixel electrode 66 and the drain 60 are electrically connected with a first contact hole 70. Furthermore, the transparent pre-repair electrode 68 is electrically connected to the drain 60 via a second contact hole 71, which is embedded in the second dielectric layer 64. The transparent pixel electrode 66 and the transparent pre-repair electrode 68 in the present invention may be materials of Indium Tin Oxide (ITO), Indium Zinc Oxide (IZO) or other transparent conductive materials. The transparent pixel electrode 66 and the transparent pre-repair electrode 68 are defined according to the patterns on the mask. The transparent pixel electrode 66 and the transparent pre-repair electrode 68 may be formed separately or simultaneously by the same processes. In the present embodiment, the transparent pre-repair electrode 68 is disposed isolated from the transparent pixel electrode 66, and is not directly connected to the transparent pixel electrode 66 disposed in the same plane. It should be noted that, the transparent pre-repair electrode 68 in the present invention is disposed corresponding to the drain 60 of the pixel structure 40 in a vertical direction, and the projected area of the transparent pre-repair electrode 68 is partially overlapped with the drain 60. Furthermore, the projected area of the transparent pre-repair electrode 68 is disposed over the upper drain 601 and the lower drain 602, which are the components of the Z-shaped step-like drain 60. In addition, the pixel structure 40 shown in FIG. 3 and FIG. 4 operates as normal ones. The formation of the transparent pre-repair electrode 68 dose not influence the color performance of the pixel structure 40 or the electrical connection with other related elements.

Figure 5:
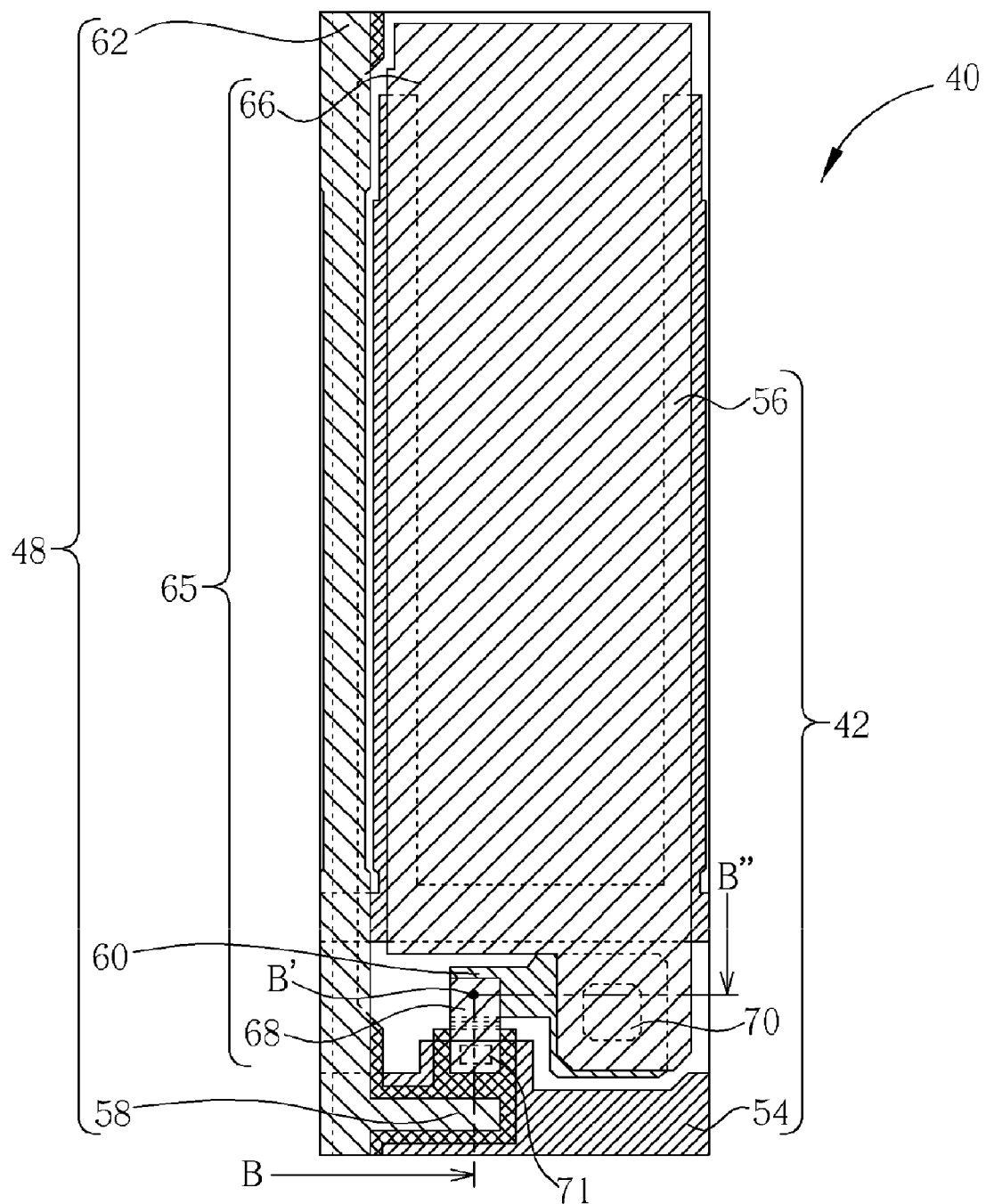
FIG. 5 to FIG. 8 are schematic diagrams showing a method of repairing a pixel structure according to another present embodiment of the present invention.
Figure 6:
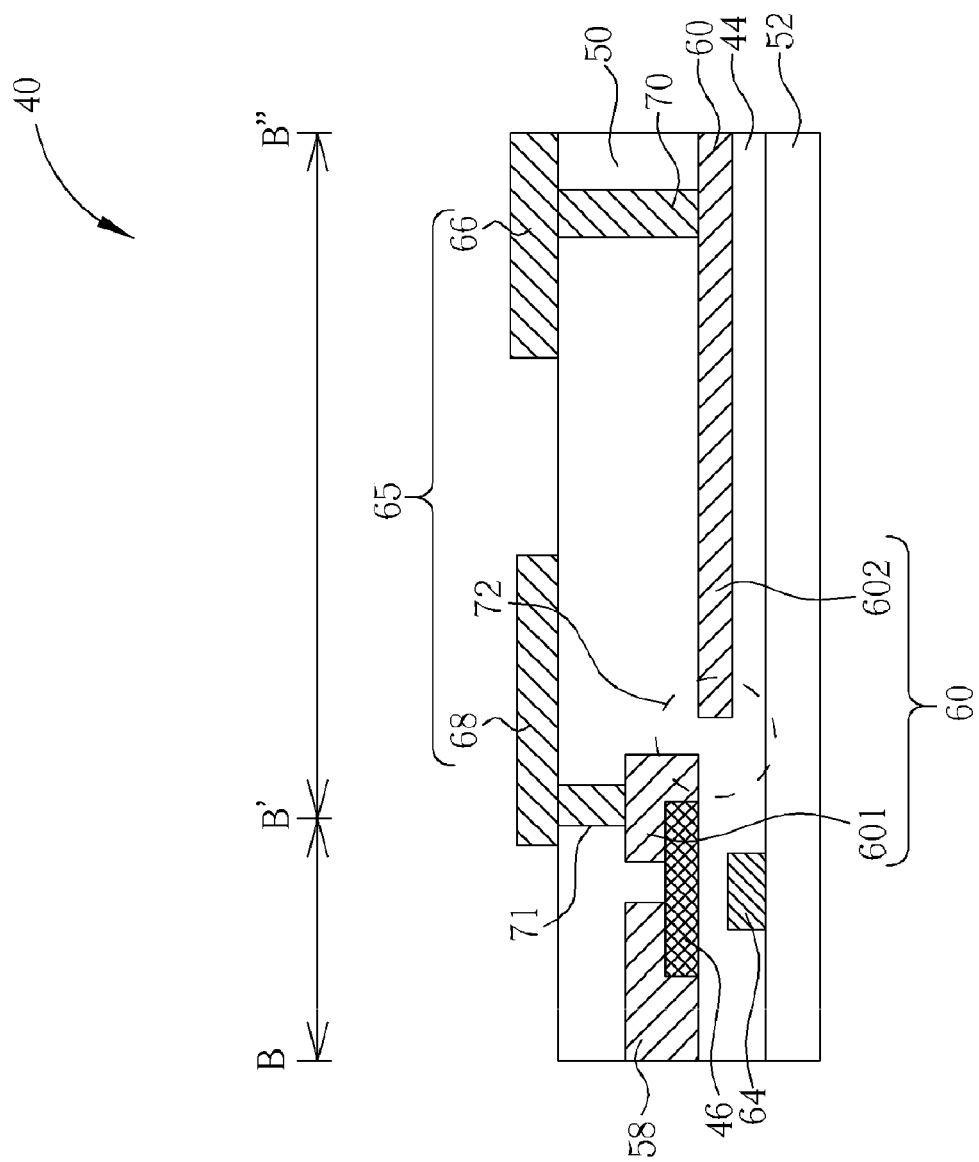
Figure 7:
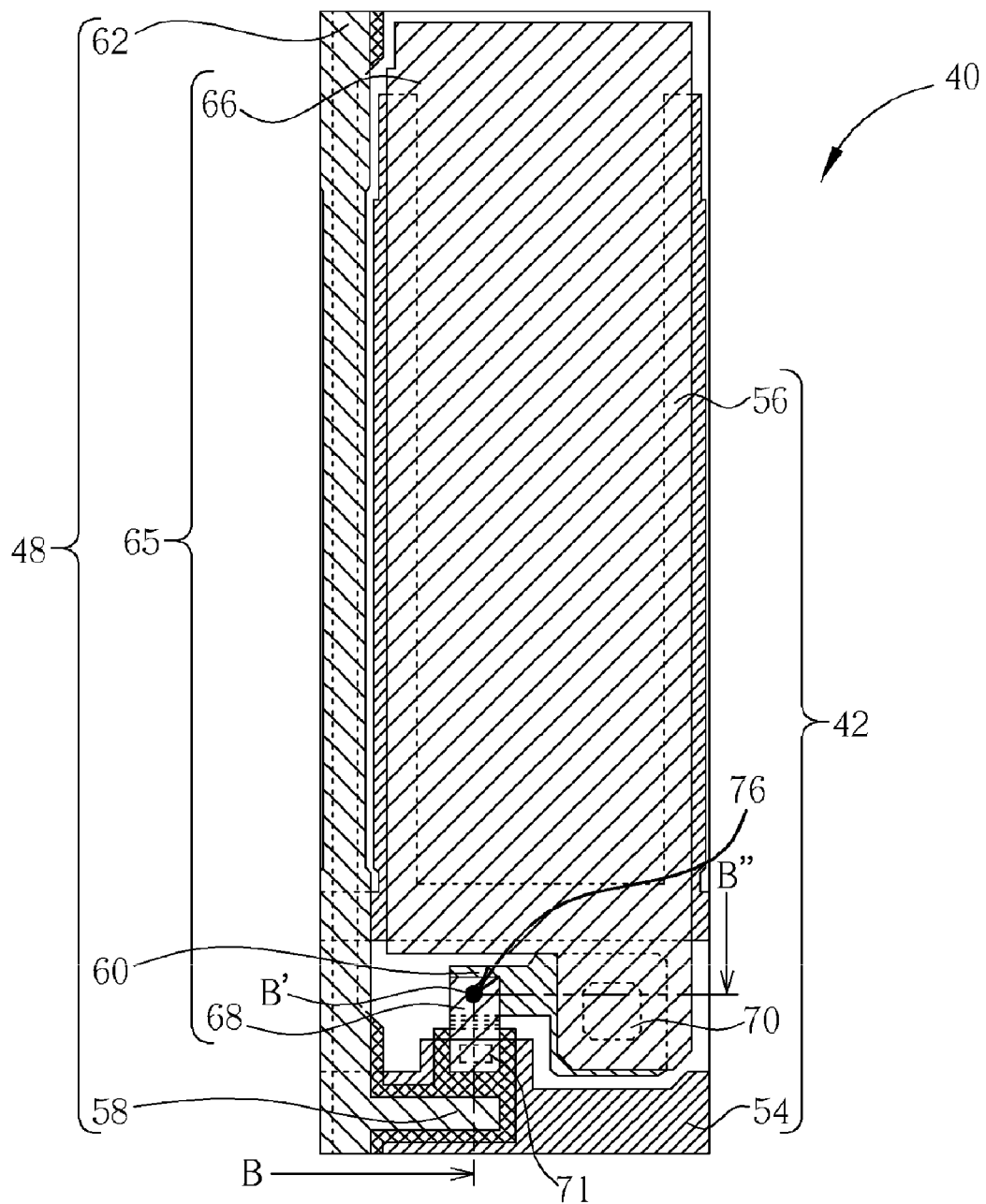
Figure 8:
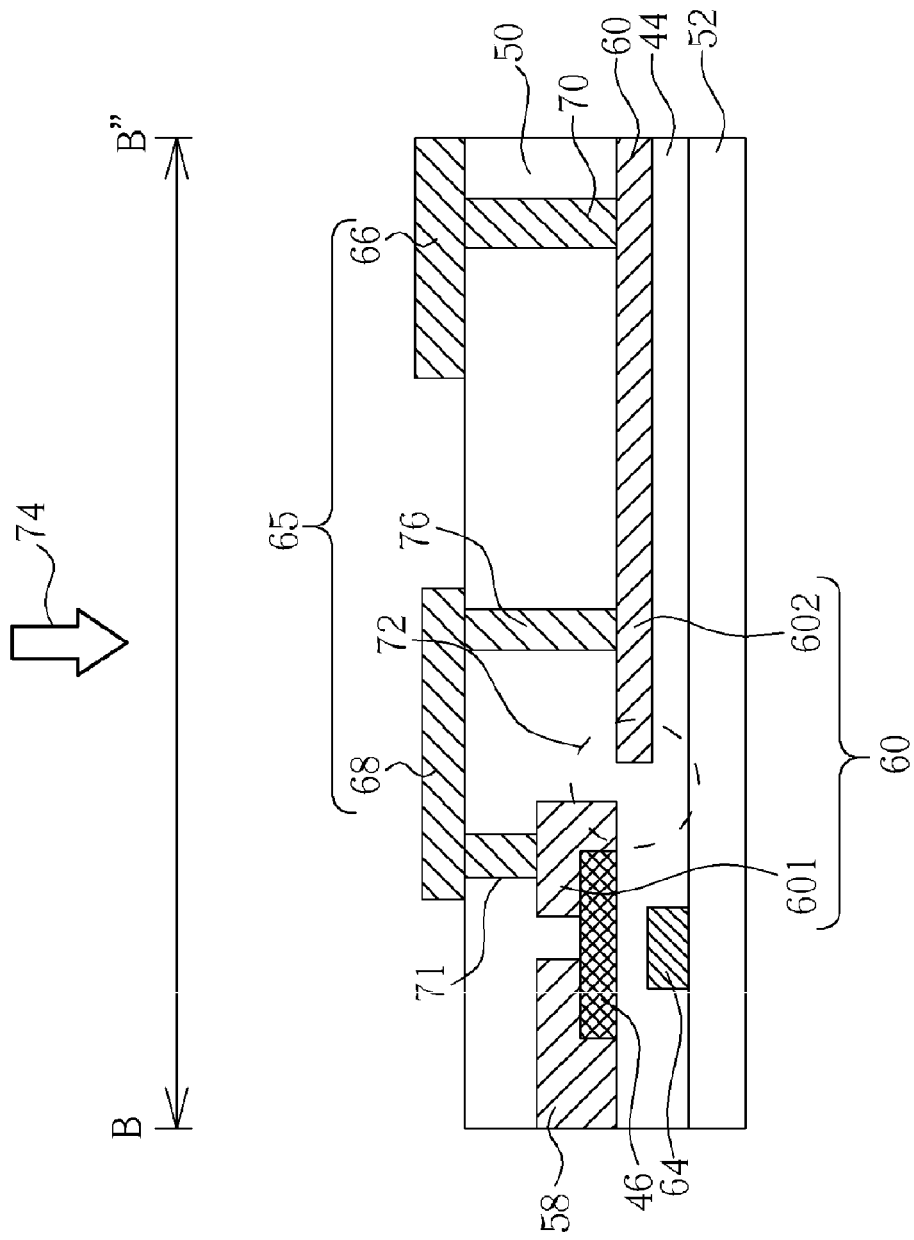

Next, please refer to FIG. 5 to FIG. 8. FIG. 5 to FIG. 8 are schematic diagrams showing a method of repairing a pixel structure according to another present embodiment of the present invention. FIG. 5 to FIG. 8 illustrate the method of repairing the pixel structure for repairing a broken circuit, short circuit, or other defect occurs to the repairable pixel structure of an LCD in the present invention. FIG. 5 and FIG. 7 are plane view diagrams of the pixel structure 40. FIG. 6 is a schematic cross-sectional view taken along the line B-B'B" in FIG. 5 and FIG. 8 is a schematic cross-sectional view taken along the line B-B'B" in FIG. 7. For simplicity of illustration, elements in the figures that are the same as those in the present embodiment use the same element numberings. The detail functions, the materials and the structures of the elements are shown in the present embodiment. Please refer to FIG. 5, FIG. 6 in company with FIG. 3 and FIG. 4. The transparent pre-repair electrode 68 of the pixel structure 40 is electrically connected to the drain 60 via the second contact hole 71. The transparent pixel electrode 66 is electrically connected to the drain 60 via the first contact hole 70. The drain 60 includes two parts, which are respectively disposed on two planes, an upper drain 601 disposed on the upper plane that is electrically connected to the transparent pre-repair electrode 68 and a lower drain 602 disposed on the lower plane that is electrically connected to the transparent pixel electrode 66. Breakage may occur at the turning portion 72 of the Z-shaped step-like structure of the drain 60 during the manufacturing processes. The electrical connection between the elements in the pixel structure 40 is disconnected, leading to a broken circuit that the pixel structure cannot function normally. Generally, a circuit inspection may be carried out to determine whether the circuit is functioning normally or not; for instance, to verify whether the turning portion 72 of the drain 60 is broken or not.

Next, as shown in FIG. 7 and FIG. 8, a laser beam 74 with appropriate power and wavelength is provided to fuse the transparent pre-repair electrode 68 disposed corresponding to the lower drain 602. The transparent pre-repair electrode 68 and the lower drain 602 are welded and a third contact hole 76 is formed. Accordingly, the broken circuit resulting from the breakage of the turning portion 72 of the drain 60 is repaired by means of electrical connection through the second contact hole 71, the transparent pre-repair electrode 68, and the third contact hole 76 to the lower drain 602, in which the lower drain 602 is electrically connected to the transparent pixel electrode 66. Thus, the broken circuit of the drain 60 and the transparent pixel electrode 66 are being re-connected via the transparent pre-repair electrode 68. Therefore, the pixel structure is repaired without affecting the aperture ratio of the pixel or the display quality.

Figure 9:
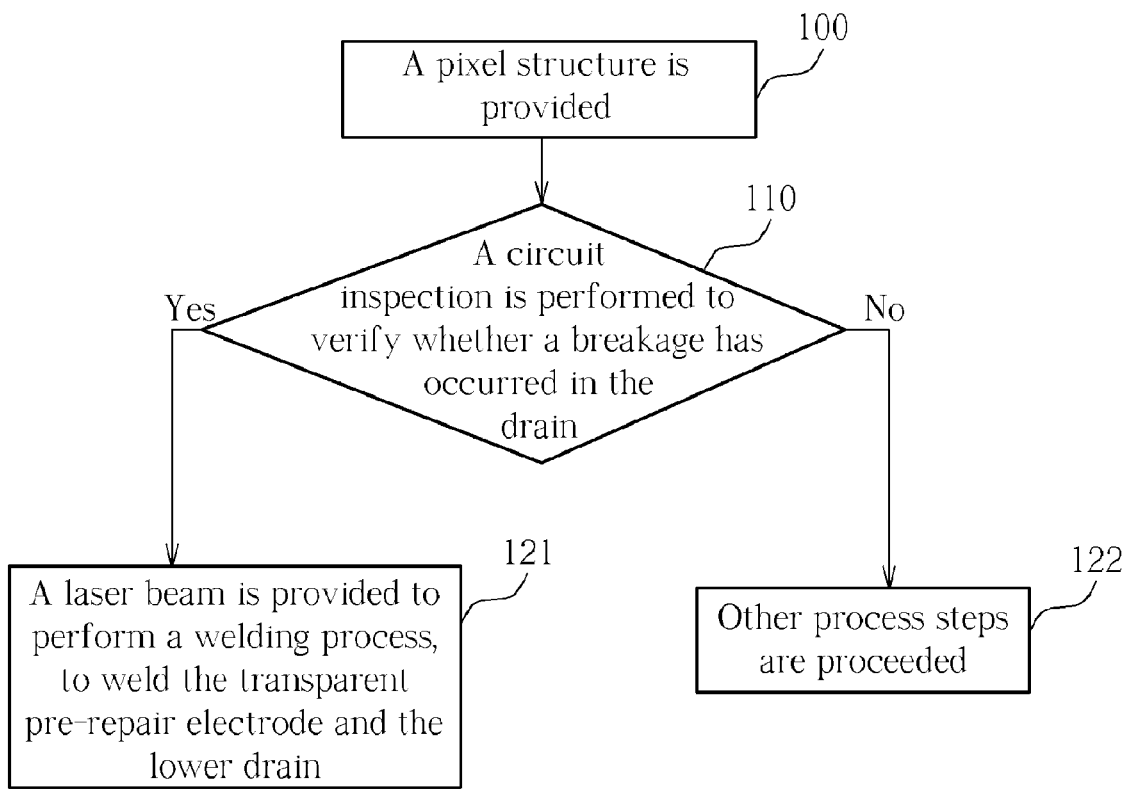
FIG. 9 is a flow chart showing a method for repairing the pixel structure according to the present invention.

To provide a better understanding, please refer to FIG. 9. FIG. 9 is a flow chart of a method for repairing the pixel structure according to the present invention. The steps of the method for repairing the pixel structure are illustrated as follows.

Step 100: A pixel structure is provided. The pixel structure includes a substrate, at least a gate line, a transparent pixel electrode, a TFT, and a transparent pre-repair electrode. The TFT includes a gate, a drain and a source. The drain includes an upper drain and a lower drain. The upper drain is electrically connected to the transparent pre-repair electrode, and the lower drain is electrically connected to the transparent pixel electrode.

Step 110: A circuit inspection is performed to verify the circuit connection of the pixel structure, and particularly, to verify whether a breakage occurs in the drain, causing the broken circuit between the upper drain and the lower drain.

If a breakage occurs in the drain of the pixel structure, step 121 is performed.

Step 121: A laser beam is provided to perform a welding process and to weld the transparent pre-repair electrode and the lower drain. The pixel is repaired by means of the welding process and may function normally; or If the circuit connection of the pixel structure is functioning normally, step 122 is performed;

Step 122: The pixel structure having a normal circuit function may be preceded to other process steps; for instance, package process and integration of other elements for fabricating an electronic display device for consumers.

It is worth to be noted that the laser beam used in the present embodiment radiates at the upper surface of the transparent pre-repair electrode 68 to weld the pre-repair electrode 68 to the lower drain 602. Repairing the pixel electrode 40 by means of welding the transparent pre-repair electrode 68 to the lower drain 602 may effectively save the area for repair and reduce the possibility of repairing the pixel structure 40 again. Secondly, the method of repairing the pixel structure of the LCD in the present invention is not limited to utilizing a laser beam to enter the pixel structure 40 via the upper surface of the transparent pre-repair electrode 68. The laser beam can also enter from a lower surface of the substrate 52 and pass through the first dielectric layer 44. The energy of the laser beam is utilized to weld the lower drain 602 and the transparent pre-repair electrode 68. In addition, the welding the transparent pre-repair electrode 68 and the lower drain 602 is not limited to the laser beam disclosed in the present embodiment. Any other process methods or tools that provide energy for welding without damaging the pixel structure 40 or the related elements may be applied to the present invention.

In sum, the present invention provides a repairable pixel structure of the LCD and a method of repairing the same. When a broken circuit occurs in the drain of the pixel structure, a laser beam can be used to weld the transparent pre-repair electrode to the drain of the present invention, repairing the defect pixel structure. In addition, there is no possibility of light leakage in the repaired pixel structure of the present invention. The method of the present invention does not affect the aperture ratio, and the pixel structure that has accomplished the repair process can display normally, thus decreasing the cost and enhancing the yield of manufacturing the LCD.

Those skilled in the art will readily observe that numerous modifications and alterations of the device and method may be made while retaining the teachings of the invention.

What is claimed is:

1. A pixel structure, comprising:
   a substrate;
   a first metal layer disposed on the substrate, the first metal layer comprising at least a gate line;
   a first dielectric layer disposed on the substrate and covering the first metal layer;
   a semiconductor layer disposed on the first dielectric layer, the semiconductor layer comprising at least a channel disposed on the gate line;
   a second metal layer disposed on the first dielectric layer and the semiconductor layer, the second metal layer comprising at least a data line, at least a source, and at least a drain;
   a second dielectric layer disposed on the second metal layer, the semiconductor layer, and the first dielectric layer; and
   a transparent electrode layer disposed on the second dielectric layer, the transparent electrode layer comprising a transparent pixel electrode and a transparent pre-repair electrode, wherein the transparent pixel electrode is electrically connected to the drain, and the transparent pre-repair electrode is also electrically connected to the drain, and wherein the transparent pixel electrode and the transparent pre-repair electrode are conductive materials in the same layer but not directly connected, and the transparent pixel electrode and the transparent pre-repair electrode are electrically connected via the drain.

2. The pixel structure of claim 1, wherein the drain has a step-like structure and is located at a side of the channel, wherein the drain comprises an upper drain adjacent to a side of the channel and a lower drain electrically connected to the upper drain.

3. The pixel structure of claim 2, wherein the transparent pre-repair electrode and the upper drain are electrically connected via at least a contact hole.

4. The pixel structure of claim 1, wherein the projected area of the transparent pre-repair electrode is partially overlapped with the drain in a vertical direction.

5. A method of repairing a pixel structure, comprising:
   providing a pixel structure, the pixel structure comprising a substrate, at least a gate line, a transparent pixel electrode, a TFT, and a transparent pre-repair electrode, wherein the TFT comprises a gate, a drain, and a source, in which the drain comprising an upper drain and a lower drain, the transparent pre-repair electrode and the upper drain are electrically connected, and the transparent pixel electrode is further electrically connected to the lower drain, and wherein the transparent pixel electrode of the pixel structure and the transparent pre-repair electrode have the same conductive materials disposed the same layer, and the transparent pixel electrode and the transparent pre-repair electrode are not directly connected in the pixel structure in the same horizontal level;
   performing a circuit inspection to the pixel structure, to verify whether the drain is broken, causing the electrical disconnection between the upper drain and the lower drain; and if the drain is broken, performing a welding process to weld the transparent pre-repair electrode and the lower drain so that the transparent pixel electrode and the transparent pre-repair electrode are electrically connected via the lower drain.

6. The method of claim 5, wherein the welding process forms a contact hole between the transparent pre-repair electrode and the lower drain to electrically connect the transparent pre-repair electrode and the lower drain.

7. The method of claim 5, wherein the projected area of the transparent pre-repair electrode is partially overlapped with the upper drain and the lower drain in a vertical direction.

8. The method of claim 5, wherein the TFT comprises a channel, and the upper drain is adjacent to a side of the channel.

9. The method of claim 5, wherein the welding process is performed by utilizing a laser beam.

* * * * *

UNITED STATES PATENT AND TRADEMARK OFFICE
CERTIFICATE OF CORRECTION

| | | |
|---|---|---|
| PATENT NO. | : 8,199,274 B2 | Page 1 of 1 |
| APPLICATION NO. | : 12/388498 | |
| DATED | : June 12, 2012 | |
| INVENTOR(S) | : Chien-Ming Chen et al. | |

It is certified that error appears in the above-identified patent and that said Letters Patent is hereby corrected as shown below:

On the title page, item (75), correct the name of the fourth inventor from "Chi-Liang Luo" to --Chi-Liang Kuo--.

Signed and Sealed this
Twenty-eighth Day of August, 2012

David J. Kappos
*Director of the United States Patent and Trademark Office*